US008343875B2

(12) United States Patent
Juengling et al.

(10) Patent No.: US 8,343,875 B2
(45) Date of Patent: Jan. 1, 2013

(54) METHODS OF FORMING AN INTEGRATED CIRCUIT WITH SELF-ALIGNED TRENCH FORMATION

(75) Inventors: Werner Juengling, Boise, ID (US); Richard Lane, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/347,478

(22) Filed: Jan. 10, 2012

(65) Prior Publication Data
US 2012/0108069 A1 May 3, 2012

Related U.S. Application Data

(62) Division of application No. 12/209,117, filed on Sep. 11, 2008, now Pat. No. 8,101,497.

(51) Int. Cl.
H01L 21/3105 (2006.01)
(52) U.S. Cl. .............................. 438/696; 257/E21.243
(58) Field of Classification Search .................. 438/424, 438/696; 257/E21.243
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,838,991 A | 6/1989 | Cote et al. | |
| 4,855,804 A | 8/1989 | Bergami et al. | |
| 4,984,039 A | 1/1991 | Douglas | |
| 5,013,680 A | 5/1991 | Lowrey et al. | |
| 5,047,117 A | 9/1991 | Roberts | |
| 5,053,105 A | 10/1991 | Fox, III | |
| 5,087,586 A | 2/1992 | Chan et al. | |
| 5,117,027 A | 5/1992 | Bernhardt et al. | |
| 5,229,316 A | 7/1993 | Lee et al. | |
| 5,315,142 A | 5/1994 | Acovic et al. | |

(Continued)

FOREIGN PATENT DOCUMENTS

DE 280 851 A1 7/1990

(Continued)

OTHER PUBLICATIONS

Advertisement entitled "Polysilazane SODs Spinfill™ 400 Series for STI/PMD Application," (Undated).

(Continued)

*Primary Examiner* — Calvin Lee
*Assistant Examiner* — Monica D Harrison
(74) *Attorney, Agent, or Firm* — Knobbe, Martens, Olson & Bear, LLP

(57) ABSTRACT

Methods for forming a semiconductor device include forming self-aligned trenches, in which a first set of trenches is used to align a second set of trenches. Methods taught herein can be used as a pitch doubling technique, and may therefore enhance device integration. Further, employing a very thin CMP stop layer, and recessing surrounding materials by about an equal amount to the thickness of the CMP stop layer, provides improved planarity at the surface of the device.

20 Claims, 11 Drawing Sheets

U.S. PATENT DOCUMENTS

| | | | |
|---|---|---|---|
| 5,319,753 A | 6/1994 | MacKenna et al. |
| 5,328,810 A | 7/1994 | Lowrey et al. |
| 5,330,879 A | 7/1994 | Dennison |
| 5,398,205 A | 3/1995 | Yamaguchi |
| 5,408,116 A | 4/1995 | Tanaka et al. |
| 5,447,884 A | 9/1995 | Fahey et al. |
| 5,470,661 A | 11/1995 | Bailey et al. |
| 5,492,858 A | 2/1996 | Bose et al. |
| 5,502,320 A | 3/1996 | Yamada |
| 5,514,885 A | 5/1996 | Myrick |
| 5,583,065 A | 12/1996 | Miwa |
| 5,670,794 A | 9/1997 | Manning |
| 5,679,591 A | 10/1997 | Lin et al. |
| 5,702,976 A | 12/1997 | Schuegraf et al. |
| 5,753,546 A | 5/1998 | Koh et al. |
| 5,789,320 A | 8/1998 | Andricacos et al. |
| 5,795,830 A | 8/1998 | Cronin et al. |
| 5,869,384 A | 2/1999 | Yu et al. |
| 5,899,746 A | 5/1999 | Mukai |
| 5,905,285 A | 5/1999 | Gardner et al. |
| 5,926,717 A | 7/1999 | Michael et al. |
| 5,998,256 A | 12/1999 | Juengling |
| 6,004,862 A | 12/1999 | Kim et al. |
| 6,010,946 A | 1/2000 | Hisamune et al. |
| 6,027,982 A | 2/2000 | Peidous et al. |
| 6,037,238 A | 3/2000 | Chang et al. |
| 6,042,998 A | 3/2000 | Brueck et al. |
| 6,046,487 A | 4/2000 | Benedict et al. |
| 6,057,573 A | 5/2000 | Kirsch et al. |
| 6,063,688 A | 5/2000 | Doyle et al. |
| 6,071,789 A | 6/2000 | Yang et al. |
| 6,074,931 A | 6/2000 | Chang et al. |
| 6,110,837 A | 8/2000 | Linliu et al. |
| 6,150,688 A | 11/2000 | Maeda et al. |
| 6,211,044 B1 | 4/2001 | Xiang et al. |
| 6,229,169 B1 | 5/2001 | Hofmann et al. |
| 6,265,285 B1 | 7/2001 | Tseng |
| 6,282,113 B1 | 8/2001 | Debrosse |
| 6,288,454 B1 | 9/2001 | Allman et al. |
| 6,291,334 B1 | 9/2001 | Somekh |
| 6,297,127 B1 | 10/2001 | Chen et al. |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor et al. |
| 6,372,602 B1 | 4/2002 | Mitsuiki |
| 6,383,907 B1 | 5/2002 | Hasegawa et al. |
| 6,395,613 B1 | 5/2002 | Juengling |
| 6,404,056 B1 | 6/2002 | Kuge et al. |
| 6,423,474 B1 | 7/2002 | Holscher |
| 6,455,372 B1 | 9/2002 | Weimer |
| 6,461,937 B1 | 10/2002 | Kim et al. |
| 6,468,887 B2 | 10/2002 | Iwasa et al. |
| 6,475,867 B1 | 11/2002 | Hui et al. |
| 6,475,875 B1 * | 11/2002 | Hau et al. ............ 438/424 |
| 6,500,726 B2 | 12/2002 | Lee et al. |
| 6,500,763 B2 | 12/2002 | Kim et al. |
| 6,514,884 B2 | 2/2003 | Maeda |
| 6,518,148 B1 | 2/2003 | Cheng et al. |
| 6,522,584 B1 | 2/2003 | Chen et al. |
| 6,534,243 B1 | 3/2003 | Templeton |
| 6,548,396 B2 | 4/2003 | Naik et al. |
| 6,551,878 B2 | 4/2003 | Clampitt et al. |
| 6,558,756 B2 | 5/2003 | Sugahara et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,576,558 B1 | 6/2003 | Lin et al. |
| 6,597,203 B2 | 7/2003 | Forbes |
| 6,599,684 B2 | 7/2003 | Reynolds et al. |
| 6,602,779 B1 | 8/2003 | Li et al. |
| 6,627,933 B2 | 9/2003 | Juengling |
| 6,632,741 B1 | 10/2003 | Clevenger et al. |
| 6,638,441 B2 | 10/2003 | Chang et al. |
| 6,657,276 B1 | 12/2003 | Karlsson et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,693,026 B2 | 2/2004 | Kim |
| 6,693,324 B2 | 2/2004 | Maegawa et al. |
| 6,699,799 B2 | 3/2004 | Ahn et al. |
| 6,706,571 B1 | 3/2004 | Yu et al. |
| 6,707,092 B2 | 3/2004 | Sasaki |
| 6,709,807 B2 | 3/2004 | Hallock et al. |
| 6,713,392 B1 | 3/2004 | Ngo et al. |
| 6,717,231 B2 | 4/2004 | Kim et al. |
| 6,734,063 B2 | 5/2004 | Willer et al. |
| 6,734,107 B2 | 5/2004 | Lai et al. |
| 6,737,333 B2 | 5/2004 | Chen et al. |
| 6,744,094 B2 | 6/2004 | Forbes |
| 6,756,284 B2 | 6/2004 | Sharma |
| 6,764,949 B2 | 7/2004 | Bonser et al. |
| 6,768,663 B2 | 7/2004 | Ogata |
| 6,773,998 B1 | 8/2004 | Fisher et al. |
| 6,777,725 B2 | 8/2004 | Willer et al. |
| 6,794,699 B2 | 9/2004 | Bissey et al. |
| 6,800,930 B2 | 10/2004 | Jackson et al. |
| 6,835,662 B1 | 12/2004 | Erhardt et al. |
| 6,835,663 B2 | 12/2004 | Lipinski |
| 6,846,618 B2 | 1/2005 | Hsu et al. |
| 6,867,116 B1 | 3/2005 | Chung |
| 6,875,703 B1 | 4/2005 | Furukawa et al. |
| 6,881,627 B2 | 4/2005 | Forbes et al. |
| 6,882,006 B2 | 4/2005 | Maeda et al. |
| 6,888,187 B2 | 5/2005 | Brown et al. |
| 6,890,812 B2 | 5/2005 | Forbes et al. |
| 6,890,858 B2 | 5/2005 | Juengling et al. |
| 6,893,972 B2 | 5/2005 | Rottstegge et al. |
| 6,900,521 B2 | 5/2005 | Forbes et al. |
| 6,924,191 B2 | 8/2005 | Liu et al. |
| 6,936,507 B2 | 8/2005 | Tang et al. |
| 6,939,808 B2 | 9/2005 | Tzou et al. |
| 6,951,709 B2 | 10/2005 | Li |
| 6,956,276 B2 | 10/2005 | Hokazono |
| 6,962,867 B2 | 11/2005 | Jackson et al. |
| 7,005,240 B2 | 2/2006 | Manger et al. |
| 7,015,124 B1 | 3/2006 | Fisher et al. |
| 7,074,668 B1 | 7/2006 | Park et al. |
| 7,084,076 B2 | 8/2006 | Park et al. |
| 7,098,105 B2 | 8/2006 | Juengling |
| 7,105,431 B2 | 9/2006 | Yin et al. |
| 7,109,544 B2 | 9/2006 | Schloesser et al. |
| 7,115,525 B2 | 10/2006 | Abatchev et al. |
| 7,119,020 B2 | 10/2006 | Okamura et al. |
| 7,151,040 B2 | 12/2006 | Tran et al. |
| 7,176,104 B1 | 2/2007 | Chen et al. |
| 7,183,597 B2 | 2/2007 | Doyle |
| 7,208,379 B2 | 4/2007 | Venugopal et al. |
| 7,288,445 B2 | 10/2007 | Bryant et al. |
| 7,291,560 B2 | 11/2007 | Parascandola et al. |
| 7,391,071 B2 | 6/2008 | Park et al. |
| 7,393,789 B2 | 7/2008 | Abatchev et al. |
| 7,413,981 B2 | 8/2008 | Tang et al. |
| 7,442,976 B2 | 10/2008 | Juengling |
| 7,476,933 B2 | 1/2009 | Juengling |
| 7,736,980 B2 | 6/2010 | Juengling |
| 7,842,558 B2 | 11/2010 | Juengling |
| 2002/0001960 A1 | 1/2002 | Wu et al. |
| 2002/0022326 A1 | 2/2002 | Kunikiyo |
| 2002/0042198 A1 | 4/2002 | Bjarnason et al. |
| 2002/0063110 A1 | 5/2002 | Cantell et al. |
| 2002/0064937 A1 | 5/2002 | Kim et al. |
| 2002/0125536 A1 | 9/2002 | Iwasa et al. |
| 2002/0130348 A1 | 9/2002 | Tran |
| 2002/0130686 A1 | 9/2002 | Forbes |
| 2002/0135025 A1 | 9/2002 | Park |
| 2002/0135029 A1 | 9/2002 | Ping et al. |
| 2002/0137306 A1 | 9/2002 | Chen |
| 2002/0158273 A1 | 10/2002 | Satoh et al. |
| 2003/0006410 A1 | 1/2003 | Doyle |
| 2003/0008461 A1 | 1/2003 | Forbes et al. |
| 2003/0022522 A1 | 1/2003 | Nishiyama et al. |
| 2003/0040186 A1 | 2/2003 | Juengling et al. |
| 2003/0042542 A1 | 3/2003 | Maegawa et al. |
| 2003/0044722 A1 | 3/2003 | Hsu et al. |
| 2003/0085422 A1 | 5/2003 | Amali et al. |

| | | | |
|---|---|---|---|
| 2003/0109102 A1 | 6/2003 | Kujirai et al. | |
| 2003/0119307 A1 | 6/2003 | Bekiaris et al. | |
| 2003/0129001 A1 | 7/2003 | Kisu et al. | |
| 2003/0157436 A1 | 8/2003 | Manger et al. | |
| 2003/0207207 A1 | 11/2003 | Li | |
| 2003/0218199 A1 | 11/2003 | Forbes et al. | |
| 2003/0230234 A1 | 12/2003 | Nam et al. | |
| 2004/0000534 A1 | 1/2004 | Lipinski | |
| 2004/0023475 A1 | 2/2004 | Bonser et al. | |
| 2004/0023502 A1 | 2/2004 | Tzou et al. | |
| 2004/0036095 A1 | 2/2004 | Brown et al. | |
| 2004/0043623 A1 | 3/2004 | Liu et al. | |
| 2004/0053475 A1 | 3/2004 | Sharma | |
| 2004/0099928 A1 | 5/2004 | Nunan et al. | |
| 2004/0106257 A1 | 6/2004 | Okamura et al. | |
| 2005/0048714 A1 | 3/2005 | Noble | |
| 2005/0074949 A1 | 4/2005 | Jung et al. | |
| 2005/0079662 A1 | 4/2005 | Miki | |
| 2005/0112886 A1 | 5/2005 | Asakawa et al. | |
| 2005/0151206 A1 | 7/2005 | Schwerin | |
| 2005/0153562 A1 | 7/2005 | Furukawa et al. | |
| 2005/0167394 A1 | 8/2005 | Liu et al. | |
| 2005/0207264 A1 | 9/2005 | Hsieh et al. | |
| 2005/0272259 A1 | 12/2005 | Hong | |
| 2005/0277249 A1 | 12/2005 | Juengling | |
| 2006/0003182 A1 | 1/2006 | Lane et al. | |
| 2006/0022248 A1 | 2/2006 | Fischer et al. | |
| 2006/0024945 A1 | 2/2006 | Kim et al. | |
| 2006/0028859 A1 | 2/2006 | Forbes | |
| 2006/0046200 A1 | 3/2006 | Abatchev et al. | |
| 2006/0046201 A1 | 3/2006 | Sandhu et al. | |
| 2006/0046407 A1 | 3/2006 | Juengling | |
| 2006/0046422 A1 | 3/2006 | Tran et al. | |
| 2006/0083996 A1 | 4/2006 | Kim | |
| 2006/0172540 A1 | 8/2006 | Marks et al. | |
| 2006/0211260 A1 | 9/2006 | Tran et al. | |
| 2006/0216293 A1 | 9/2006 | Couto et al. | |
| 2006/0216923 A1 | 9/2006 | Tran et al. | |
| 2006/0231900 A1 | 10/2006 | Lee et al. | |
| 2006/0258109 A1 | 11/2006 | Juengling | |
| 2006/0263699 A1 | 11/2006 | Abatchev et al. | |
| 2006/0267075 A1 | 11/2006 | Sandhu et al. | |
| 2006/0273456 A1 | 12/2006 | Sant et al. | |
| 2006/0278911 A1 | 12/2006 | Eppich | |
| 2006/0281266 A1 | 12/2006 | Wells | |
| 2007/0026672 A1 | 2/2007 | Tang et al. | |
| 2007/0045712 A1 | 3/2007 | Haller et al. | |
| 2007/0048674 A1 | 3/2007 | Wells | |
| 2007/0049011 A1 | 3/2007 | Tran | |
| 2007/0049030 A1 | 3/2007 | Sandhu et al. | |
| 2007/0049032 A1 | 3/2007 | Abatchev et al. | |
| 2007/0049035 A1 | 3/2007 | Tran | |
| 2007/0049040 A1 | 3/2007 | Bai et al. | |
| 2007/0050748 A1 | 3/2007 | Juengling | |
| 2007/0145450 A1 | 6/2007 | Wang et al. | |
| 2007/0210449 A1 | 9/2007 | Caspary et al. | |
| 2007/0215960 A1 | 9/2007 | Zhu et al. | |
| 2007/0218645 A1 | 9/2007 | Zhou | |
| 2007/0275309 A1 | 11/2007 | Liu | |
| 2008/0085612 A1 | 4/2008 | Smythe et al. | |
| 2009/0117705 A1 | 5/2009 | Oh | |
| 2010/0230733 A1 | 9/2010 | Juengling | |
| 2011/0042755 A1 | 2/2011 | Juengling | |

FOREIGN PATENT DOCUMENTS

| | | |
|---|---|---|
| DE | 42 36 609 A1 | 5/1994 |
| DE | 44 08 764 A1 | 9/1994 |
| DE | 199 28 781 C1 | 7/2000 |
| EP | 0 227 303 A2 | 7/1987 |
| EP | 0 491 408 A2 | 6/1992 |
| EP | 1 357 433 A2 | 10/2003 |
| JP | 05343370 | 12/1993 |
| JP | H8-55908 | 2/1996 |
| JP | H8-55920 | 2/1996 |
| WO | WO 94/15261 A1 | 7/1994 |
| WO | WO 01/01489 A1 | 1/2001 |
| WO | WO 02/099864 A1 | 12/2002 |
| WO | WO 04/001799 A2 | 12/2003 |
| WO | WO 2004/003977 | 1/2004 |
| WO | WO 2004/073044 A2 | 8/2004 |
| WO | WO 2005/010973 A1 | 2/2005 |
| WO | WO 2005/034215 A1 | 4/2005 |
| WO | WO 2005/119741 A3 | 12/2005 |
| WO | WO 2006/026699 A2 | 3/2006 |

OTHER PUBLICATIONS

Bergeron, et al., "Resolution Enhancement Techniques for the 90nm Technology Node and Beyond", *Future Fab International*, Issue 15, 4 pages.

Bhave et al., "Developer-soluble Gap fill materials for patterning metal trenches in Via-first Dual Damascene process", preprint of Proceedings of SPIE: Advances in Resist Technology and Processing XXI, vol. 5376, John L. Sturtevant, editor, 2004, 8 pages.

Bruek, S.R.J., "Optical and interferometric lithography—Nanotechnology enablers," *Proceedings of the IEEE*, vol. 93, No. 10, Oct. 2005, pp. 1704-1721.

Choi et al., "Sublithographic nanofabrication technology for nanocatalysts and DNA chips," *J.Vac. Sci. Technol.*, Nov./Dec. 2003; pp. 2951-2955.

Chung et al., "Nanoscale Multi-Line Patterning Using Sidewall Structure", Jpn., *J.App.. Phys.* vol. 41 (2002) Pt. 1, No. 6B,pp. 4410-4414.

Chung et al., "Pattern multiplication method and the uniformity of nanoscale multiple lines", *J. Vac.Sci. Technol.* B21(4), Jul./Aug. 2003, pp. 1491-1495.

Written Opinion and International Search Report; PCT/US2005/017156.

*Ex parte Cantell*, unpublished decision of the Board of Patent Appeals and Interferences, Mar. 4, 2005.

International Search Report and Written Opinion in International Application PCT/US2005/030677.

Joubert et al., "Nanometer scale linewidth control during etching of polysilicon gates in high-density plasmas", *Microelectronic Engineering* 69 (2003), pp. 350-357.

Lim, B., *Nature* vol. 2, Nov. 2003 pp. 749-753.

Oehrlein et al., "Pattern transfer into low dielectric materials by high-density plasma etching", *Solid State Tech.*, May 2000, 8 pages.

Peters, Laura, "Choices and challenges for shallow trench isolation," Semiconductor International, Website www.reed-electronics.com, Apr. 1, 1999, 6 pages.

Sakao M. et al., "A Straight-Line-Trench Isolation and Trench-Gate Transistor (SLIT) Cell for Giga-bit DRAMs", Proceedings of IEEE VLSI Technology Symposium May 17-19, 1993 Kyoto, Japan, May 17, 1993, pp. 19-20.

Schloesser et al., "Highly Scalable Sub-50nm Vertical Double Gate Trench DRAM Cell", Memory Development Center, Infineon Tech., 2004, 4 pages.

Sheats et al., "Microlithography: Science and Technology," *Marcel Dekkar, Inc.*, pp. 104-105 (1998).

U.S. Office Action issued Jan. 24, 2008 in U.S. Appl. No. 11/490,294.
U.S. Office Action issued Jan. 29, 2008 in U.S. Appl. No. 11/367,020.
U.S. Office Action Issued Feb. 26, 2008 in U.S. Appl. No. 11/366,212.
U.S. Office Action issued Jun. 2, 2008 in U.S. Appl. No. 11/219,067.
U.S. Office Action issued Jun. 5, 2008 in U.S. Appl. No. 11/514,117.
U.S. Office Action issued Jul. 11, 2008 in U.S. Appl. No. 11/367,020.

Yan R-H et al., "Scaling the Si MOSFET: From Bulk to SOI to Bulk", IEEE Transactions on Electron Devices USA; vol. 39, No. 7, Jul. 1992, pp. 1704-1710.

International Search Report and Written Opinion, PCT Application No. PCT/US2009/053881, mailed Feb. 11, 2010, 12 pages.

Search Report and Written Opinion of Sep. 13, 2012 for Singaporean Patent Application No. 201101676-3, in 13 pages.

* cited by examiner

US 8,343,875 B2

METHODS OF FORMING AN INTEGRATED CIRCUIT WITH SELF-ALIGNED TRENCH FORMATION

CROSS REFERENCE TO RELATED APPLICATION

This application is a divisional of U.S. patent application Ser. No. 12/209,117, filed Sep. 11, 2008, titled SELF-ALIGNED TRENCH FORMATION, issued as U.S. Pat. No. 8,101,497, which is hereby incorporated herein by reference in its entirety.

FIELD OF INVENTION

Embodiments relate to methods for forming semiconductor structures, more specifically to methods for forming self-aligned trenches in semiconductor processing.

BACKGROUND OF THE INVENTION

One way that integrated circuit designers make faster and smaller integrated circuits is by reducing the separation distance between the individual elements that comprise the integrated circuit. This process of increasing the density of circuit elements across a substrate is typically referred to as "scaling" or increasing the level of device integration. In the process of designing integrated circuits with higher levels of integration, improved device constructions and fabrication methods have been developed.

BRIEF DESCRIPTION OF THE DRAWINGS

Exemplary embodiments of the invention disclosed herein are illustrated in the accompanying drawings, which are not drawn to scale but are for illustrative purposes only.

DETAILED DESCRIPTION OF THE PREFERRED EMBODIMENT

Disclosed herein are fabrication techniques for semiconductor structures including self-aligned trenches. Self-aligned trenches can be used as part of pitch doubling techniques, which promote device integration. The fabrication techniques described herein advantageously enable more precise etching, minimize stress to the substrate and/or promote planarity at the surface of the semiconductor structure.

Figure 1:
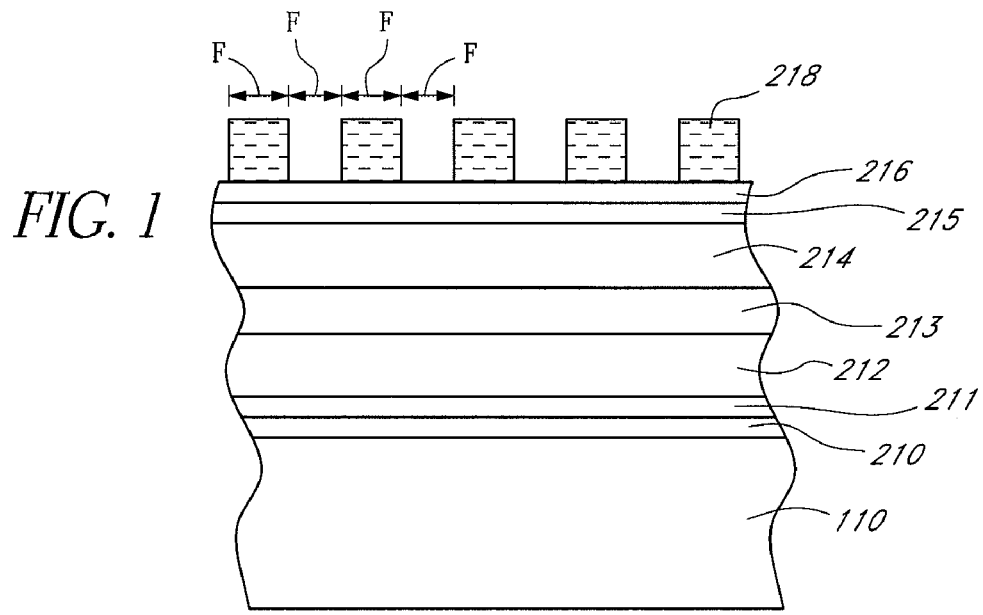
FIG. 1 illustrates a cross-sectional view of a partially formed semiconductor device.

FIG. 1 is a cross-sectional view of a partially formed semiconductor device including a substrate 110 over which several additional layers have been formed to facilitate a masking process. The substrate 110 comprises one or more of a wide variety of suitable workpieces for semiconductor processing. In some embodiments, the substrate 110 includes semiconductor structures that have been fabricated thereon, such as doped silicon platforms. While the illustrated substrate 110 comprises a monocrystalline silicon wafer, in other embodiments the substrate 110 comprises other forms of semiconductor layers, which optionally include other active or operable portions of semiconductor devices. Substrate is also used herein to refer to the workpiece including integrated layers formed thereover.

As shown in FIG. 1, in some embodiments an oxide layer 210 is grown or deposited on the substrate 110. The oxide layer 210 may comprise a thin pad oxide with a thickness between about 30 Å and 150 Å. The oxide layer 210 can be deposited using a suitable deposition process, such as chemical vapor deposition ("CVD") or physical vapor deposition ("PVD"), or is grown by oxidation of the underlying surface.

The partially formed semiconductor device of FIG. 1 also shows an etch stop 211 formed over the oxide layer 210 by a suitable deposition process such as CVD or PVD. The etch stop 211 serves as a stop layer for a later planarization step (e.g., a CMP stop layer), as will be described hereinbelow. Relative to conventional CMP stop layers, the etch stop 211 can be very thin, e.g., may have a thickness between about 20 Å and 150 Å, more particularly between about 50 Å and 100 Å. As will be appreciated from the description below, this thin etch stop can improve planarity for subsequent processing. In some embodiments, the etch stop 211 comprises nitride, such as silicon nitride ("$Si_3N_4$"). In other embodiments, the etch stop 211 comprises aluminum oxide ("$Al_2O_3$") or another material against which a neighboring material, particularly silicon oxide, can be selectively etched by a chemical and/or mechanical etching process.

As shown in FIG. 1, some embodiments also provide a placeholder material 212 formed above the etch stop 211. Advantageously, the placeholder material 212 may have a thickness sufficient to provide space for the formation of a spacer material in a later step, as described hereinbelow. Thus, the placeholder material 212 may have a thickness suitable for later definition of a sidewall spacer height, such as between about 500 Å to 3000 Å, more particularly 800 Å to 1000 Å. In the illustrated embodiment, the placeholder material 212 comprises polysilicon, although other materials that are selectively etchable with respect to surrounding materials, and particularly trench isolation materials, can also be used.

In accordance with embodiments of the present invention, a hard mask is provided for etching a first set of trenches. In the embodiment shown in FIG. 1, two hard mask layers 213, 214 are provided, the first hard mask layer 214 being used to pattern the second hard mask layer 213, and the second hard mask layer 213 serving as the mask through which the first set of trenches will be etched. This embodiment is described in greater detail below, as this arrangement provides certain performance advantages, such as an improved aspect ratio for etching the first set of trenches. However, other embodiments are also possible wherein a first set of trenches is etched using only a single hard mask, such as by using a photomask to etch a carbon hard mask and then etching the trenches through the carbon hard mask. In still other embodiments, no hard mask is used at all and instead the first set of trenches are simply formed using a photomask.

Referring again to the embodiment illustrated in FIG. 1, the second hard mask layer 213 is formed over the placeholder material 212 by any suitable deposition process such as CVD or PVD. The second hard mask layer 213 may comprise a form of silicon oxide, such as tetraethylorthosilicate ("TEOS"), and it may have a thickness between about 500 Å to 1500 Å, more particularly 800 Å to 1200 Å. The first hard mask layer 214 can comprise carbon, such as amorphous carbon. In particular, the amorphous carbon can be a form of transparent carbon that is highly transparent to light, such as is disclosed in A. Helmbold, D. Meissner, Thin Solid Films, 283 (1996), 196-203, the entire disclosure of which is incorporated herein by reference. The first hard mask layer 214 may have a thickness between about 1000 Å to 3000 Å, more particularly 1800 Å to 2200 Å. Accordingly, the fraction of the thickness of the second hard mask 213 as a percentage of the thickness of the first hard mask 214 is less than 100%, more particularly 30-70%, even more particularly 40-60%. This reduced thickness of second hard mask layer 213, as compared to the first hard mask layer 214, advantageously provides a lower aspect ratio when the first set of trenches are etched as compared to using the first hard mask 214 directly.

As shown in FIG. 1, some embodiments also provide coatings 215, 216 formed above the first hard mask 214. A dielectric antireflective coating ("DARC") 215 advantageously protects the first hard mask 214. The DARC 215 may comprise a silicon rich material, such as silicon oxynitride ("$Si_xO_yN_z$"). An organic bottom antireflective coating ("BARC") 216 may also be included at the interface with a photoresist 218.

The photoresist 218 shown in FIG. 1 provides the pattern for removing portions of the first hard mask 214 through photolithography and etching techniques. In some embodiments, as shown in FIG. 1, the photoresist 218 provides a pattern of parallel lines (shown in cross-section in FIG. 1; see also FIG. 13) separated from each other by gaps. In some embodiments, such as when a high degree of device integration is desired, the width of the lines and the gaps between the lines may be approximately equal to "F", where F can be the minimum feature size formable using a particular photolithographic technique. In general, however, "F" is used in the figures to represent relative dimensions. The skilled artisan will appreciate that the methods described herein can be implemented where F is greater than the minimum resolution. Other embodiments can utilize photoresists 218 defining other patterns, which in turn produce different configurations of trenches in later steps. In an exemplary embodiment, the photoresist 218 is formed by spinning on a photosensitive material, exposing the photosensitive material to light through a mask containing the desired pattern, and then developing the material into the photoresist 218. Next, the first hard mask 214 can be etched through the gaps in the photoresist 218. After the photolithography and etching of the first hard mask 214 has been carried out, the photoresist 218 can be stripped, or the photoresist can be removed during the etching of the first hard mask 214, thus producing the partially formed semiconductor device shown in FIG. 2.

Figure 2:
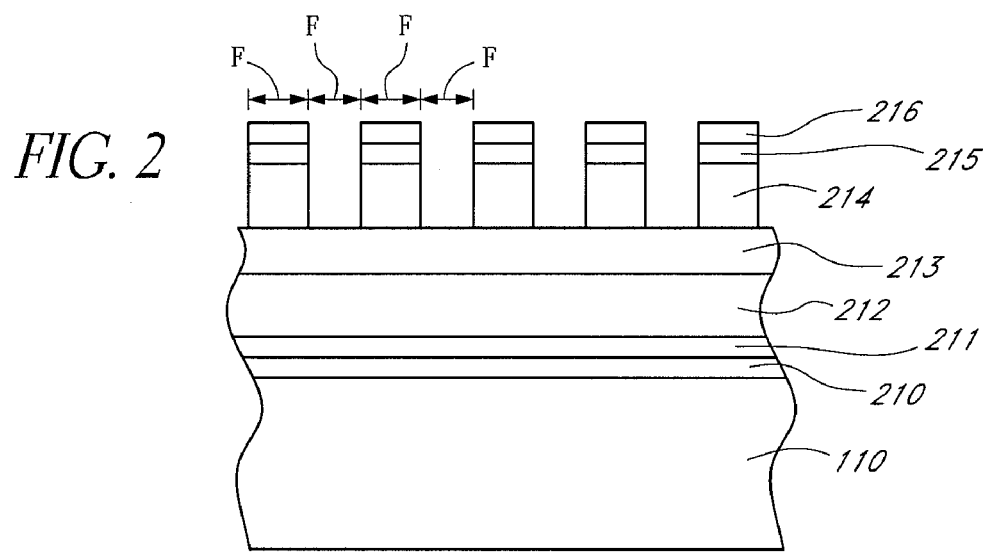
FIG. 2 illustrates a cross-sectional View of the partially formed semiconductor device of FIG. 1 after a photo mask has been used to pattern a hard mask.
Figure 3:
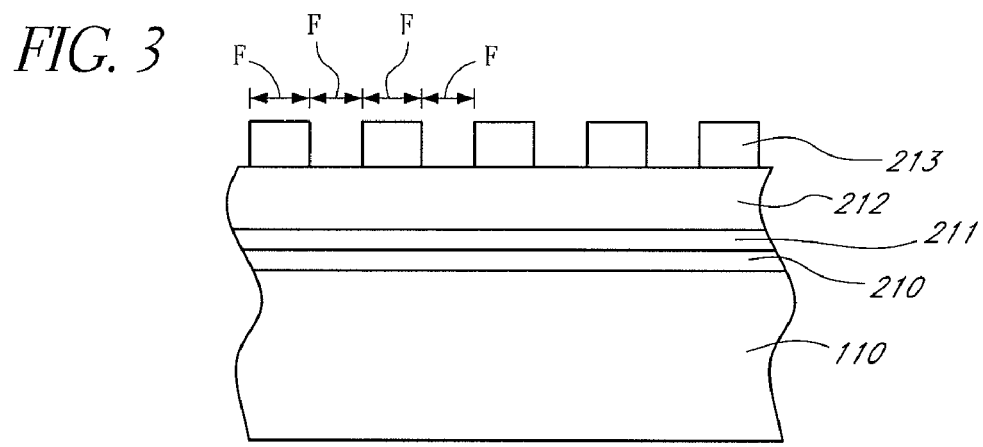
FIG. 3 illustrates a cross-sectional view of the partially formed semiconductor device of FIG. 2 after the hard mask has been used to pattern a second hard mask.

In FIG. 2, a first hard mask 214 has been etched with a pattern of alternating lines and gaps. As noted above, in some embodiments, the first set of trenches can be etched into the substrate through the first hard mask 214. However, in the embodiment illustrated in FIGS. 2-3, the relatively thinner second hard mask 213 is etched through the thicker first hard mask 214, and the first hard mask 214 is then removed. This process produces the partially formed semiconductor device shown in FIG. 3, in which the second hard mask 213 has been patterned.

Figure 4:
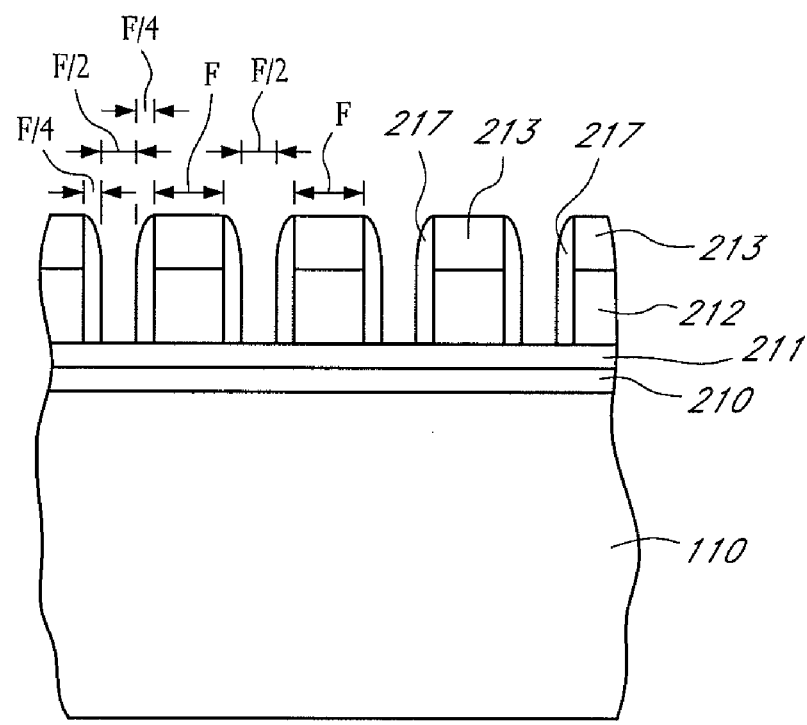
FIG. 4 illustrates a cross-sectional View of the partially formed semiconductor device of FIG. 3 after certain layers have been patterned and spacers formed therein.

With reference to FIG. 4, the pattern of the second hard mask 213 has been transferred (e.g., via selective wet etch) to the placeholder material 212. An upper sidewall spacer 217 can be formed along the sidewalls of the placeholder material 212 and the second hard mask 213. The upper sidewall spacer 217 can be formed by conformally depositing a uniformly thick silicon oxide, such as the same material in the second hard mask 213, over upper and sidewall surfaces, and then directionally etching the deposited oxide such that horizontal surfaces are preferentially removed but the upper sidewall spacer 217 remains in the desired locations. In some embodiments, the upper sidewall spacers 217 have a thickness of approximately ¼ F, which can provide a gap between the upper sidewall spacers 217 of approximately ½ F. Such configurations can advantageously provide two uniform sets of trenches with approximately equal widths and separated by approximately equal distances, as will be described hereinbelow.

Figure 5:
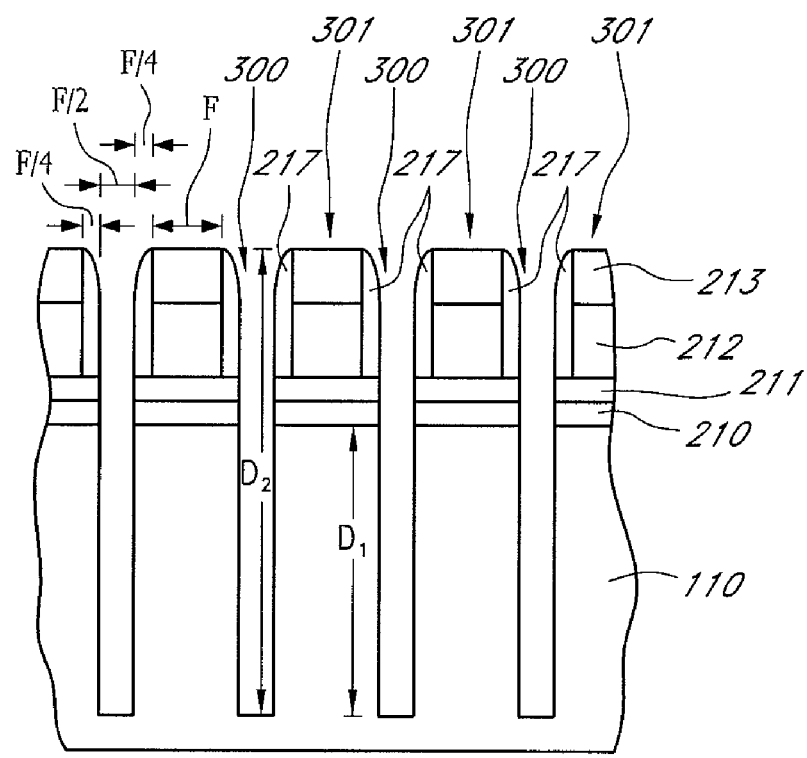
FIG. 5 illustrates a cross-sectional View of the partially formed semiconductor device of FIG. 4 after etching a first set of trenches into the substrate.

With reference to FIG. 5, a first set of trenches 300 has been etched into the substrate 110 through the second hard mask 213 and the upper sidewall spacers 217. The etching process can be a selective etching process that preferentially etches the material to be removed for the trench, such as silicon, without etching the material of the second hard mask 213 and spacers 217, such as TEOS or other silicon oxide-based material. The skilled artisan will appreciate that other hard mask materials and other selective etch chemistries can be employed, such as when damascene trenches are being formed in an interlevel dielectric ("ILD"). Hence, FIG. 5 shows the second hard mask 213 still in place after the formation of the first set of trenches 300. Nonetheless, the skilled artisan will recognize that the selective etching may be imperfect, thus eliminating all or a portion of the second hard mask 213 in the process of etching the first set of trenches 300.

In some embodiments, the trenches of the first set 300 are separated by a series of inter-trench regions 301, in which a second set of trenches can later be formed. In some embodiments, the width of the inter-trench regions 301 may be approximately equal to 1.5 F. Thus, in the embodiment illustrated in FIG. 5, after the trenches of the first set 300 have been formed, the trenches have a width approximately equal to ½ F, the upper sidewall spacers 217 have a width approximately equal to ¼ F, and the inter-trench regions 301, which include the upper sidewall spacers 217, have a width approximately equal to 1.5 F.

The trenches of the first set 300 have a depth "$D_1$" defined by the distance from the top of the substrate 110 in the inter-trench regions 301 to the bottom silicon of the trenches 300 immediately after the step of etching the first set of trenches 300. In some embodiments, $D_1$ is between about 2000 Å and 3000 Å, more particularly 2000 Å to 2500 Å.

The trenches of the first set 300 also have an aspect ratio defined by the ratio between a depth "D2" of the trenches (in this case including the masking layers) and a width of the trenches at the top of the trenches. The depth D2 is defined as the distance from the top surface in the inter-trench regions 301 to the bottom of the trenches 300 immediately after the step of etching the first set of trenches 300. For reasons explained hereinabove, immediately after the step of etching the first set of trenches, the top surface of the inter-trench regions 301 may be at the top of the second hard mask 213 (as shown in FIG. 5) or at the top of the placeholder material 212. In some embodiments, the aspect ratio is between about 5:1 and 100:1, more particularly between about 10:1 and 25:1.

Figure 6:
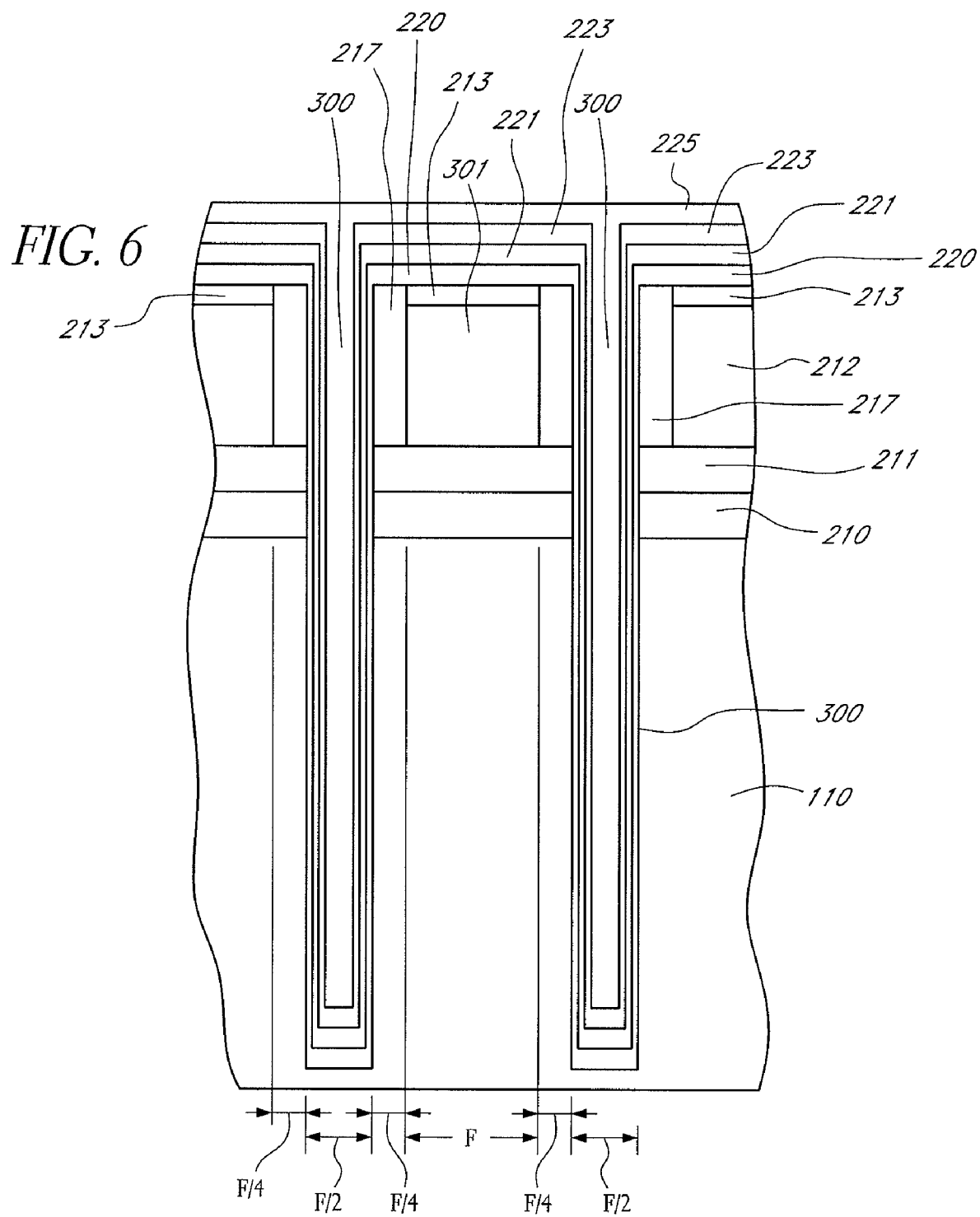
FIG. 6 illustrates a cross-sectional View of the partially formed semiconductor device of FIG. 5 after filling the trenches.

Following the formation of the first set of trenches 300, the trenches can be filled. In some embodiments, the trenches 300 may be lined with one or more liner layers. For example, in the embodiment illustrated in FIG. 6, a thin oxide layer 220 is grown in the trenches as well as the surface of the inter-trench regions 301 with a thickness of between about 20 Å to 70 Å. The oxide layer 220 advantageously repairs etch damage to the walls of the trenches 300. FIG. 6 also shows a nitride layer 221 with a thickness between about 30 Å to 100 Å that has been deposited above the oxide layer 220 as a barrier layer to facilitate later oxide densification. A TEOS layer 223 of thickness between about 100 Å to 300 Å may optionally be formed above the nitride layer 221, providing a diffusion path for more even distribution of oxidant during SOD densification. The trenches 300 are then filled with a filler material 225, such as an electrically isolating material. In an exemplary embodiment, filler material 225 comprises a spin-on dielectric. As shown in FIG. 6, the filling step may include overfilling the trenches 300, such that the filler material 225 extends above the top of the trenches 300.

Figure 7:
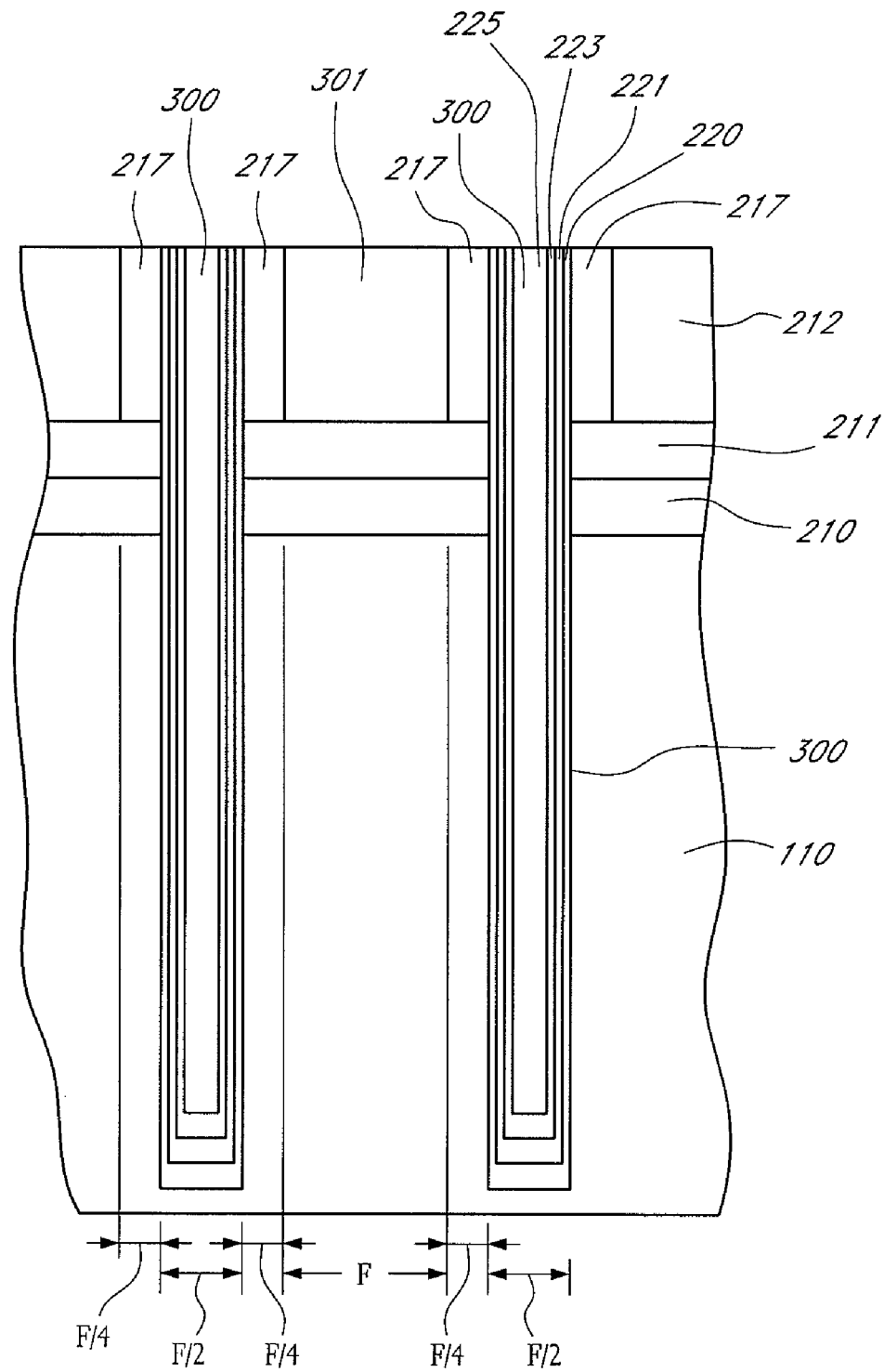
FIG. 7 illustrates a cross-sectional View of the partially formed semiconductor device of FIG. 6 after planarization.

FIG. 7 illustrates a cross-sectional view of the partially formed semiconductor device of FIG. 6 after the surface has been planarized. The planarizing process may comprise a chemical mechanical polishing process. As shown in FIG. 7, the planarizing step may stop on the placeholder material 212, such that after the planarizing step, the surface of the partially formed device comprises the filler material 225 in the trenches 300 and the exposed placeholder material 212 in the inter-trench regions 301.

Figure 8:
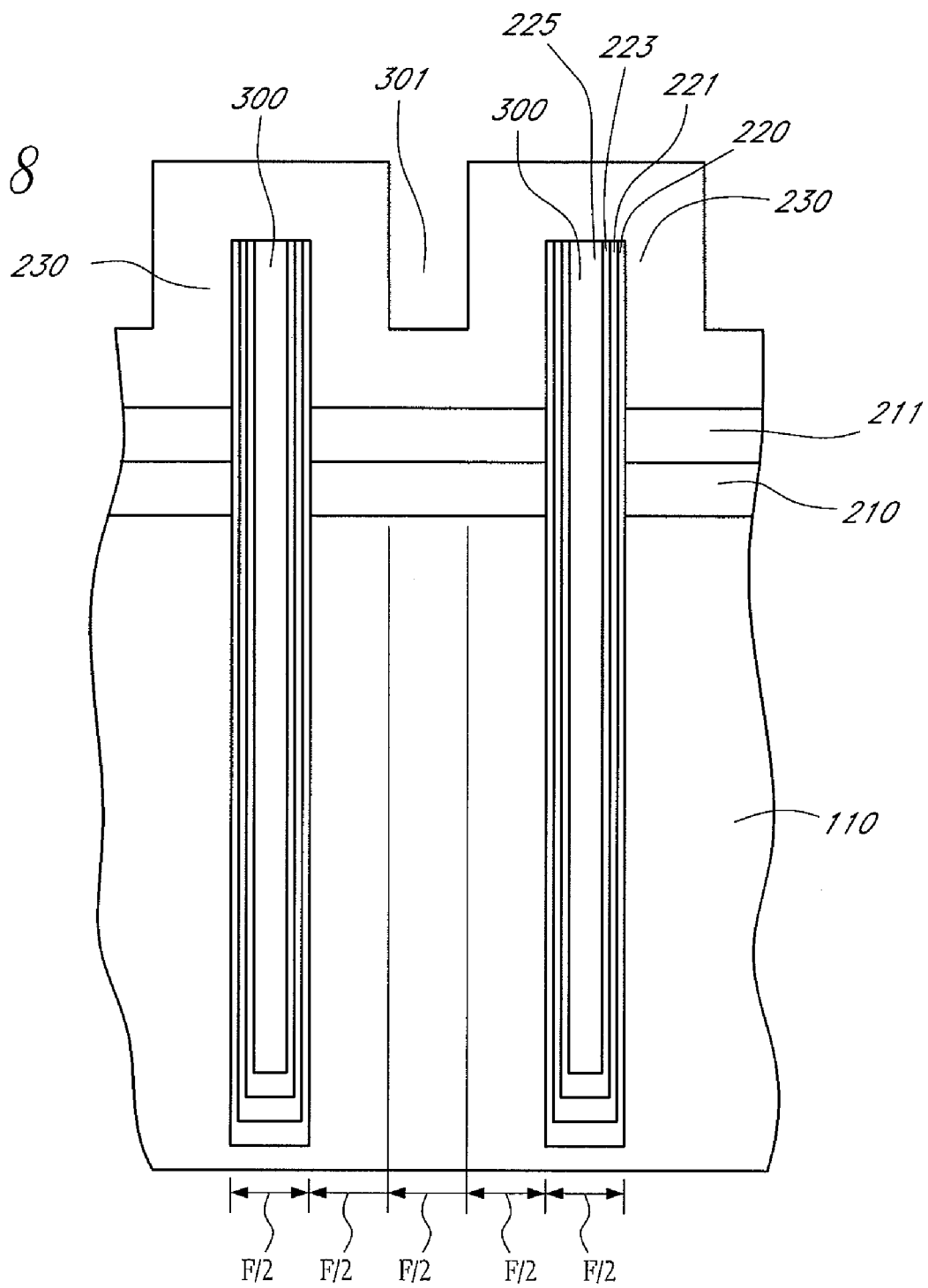
FIG. 8 illustrates a cross-sectional View of the partially formed semiconductor device of FIG. 7 after selective etching of a placeholder layer from between filled trenches and deposition of a spacer material.

Next, the upper sidewall spacers 217 can be removed (if they have not already been removed during the earlier processes), and the placeholder material 212 can be selectively etched from the inter-trench regions 301, thus producing a partially formed device in which the filler material 225 in the trenches 300 protrudes above the surface of the inter-trench regions 301. In some embodiments, TMAH can be used in an isotropic wet etch to selectively remove the placeholder material 212 from the inter-trench regions 301. A second spacer material 230, such as TEOS, may then be blanket deposited to conform to the surface of the device, as shown in FIG. 8.

The spacer material 230 can then be preferentially etched from horizontal surfaces using a directional spacer etch. The directional spacer etch leaves in place second spacer material 230 in the form of sidewall spacers on approximately vertical surfaces, such as the sidewalls of the portions of the filler material above the trenches 300, protruding above the surface of the inter-trench regions 301. These remaining portions of the second spacer material 230 can then be used to align a second set of trenches 302 within the inter-trench regions 301, spaced by the spacers from the first trenches 300. In some embodiments, following the preferential etch of the second spacer material 230, the spacer material can have a thickness approximately equal to ½ F. Such embodiments can provide approximately uniform widths of the first and second sets of trenches as well as approximately uniform spacing or gaps between the first and second sets of trenches.

Figure 9:
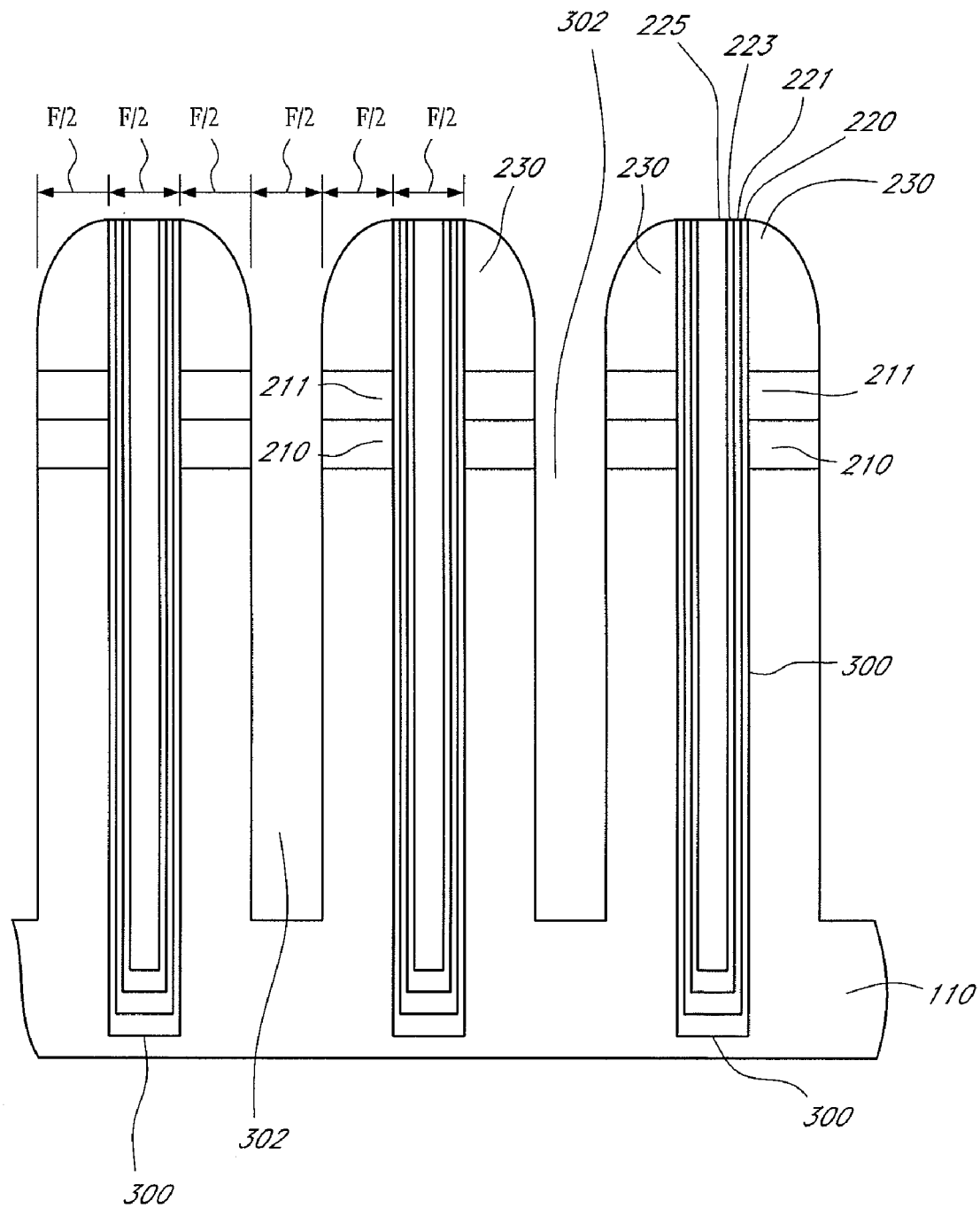
FIG. 9 illustrates a cross-sectional View of the partially formed semiconductor device of FIG. 8 after performing a spacer etch and subsequently selectively etching a second set of trenches into the substrate in a self-aligned manner.

FIG. 9 shows a cross-sectional view of the partially formed semiconductor device after the second set of trenches 302 has been etched into the substrate 110. FIG. 8 shows an embodiment in which the first trenches 300 are deeper than the second trenches 302, but other configurations are possible: the second set could be deeper than the first set, or the first set and the second set could be approximately the same depth. As noted above, embodiments can provide a technique for pitch doubling, wherein a trench of the first set 300 is spaced less than a distance F (e.g., approximately ½ F) from a trench of the second set 302.

Figure 10:
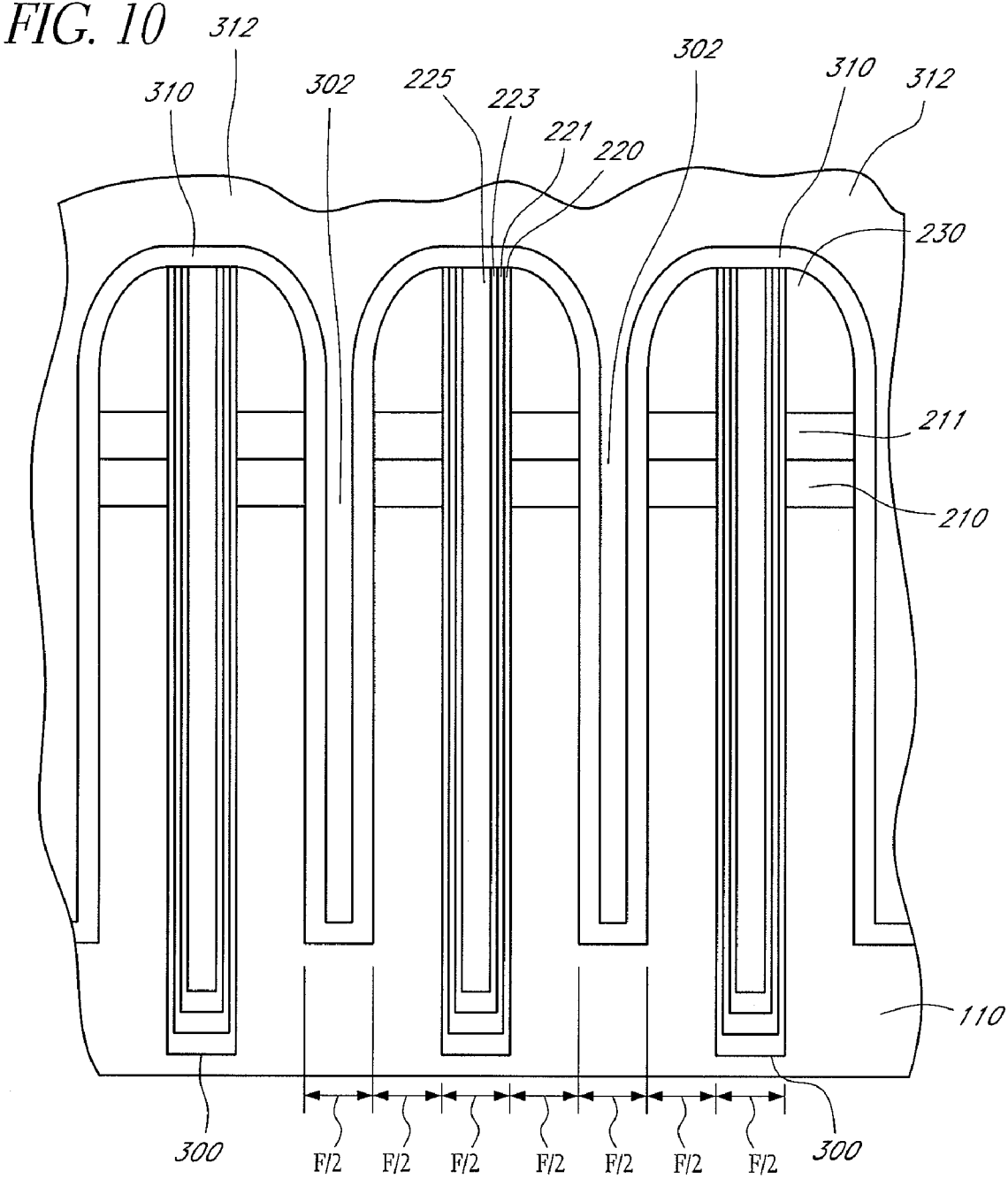
FIG. 10 illustrates a cross-sectional view of the partially formed semiconductor device of FIG. 9 after the second set of trenches have been filled

FIG. 10 shows the partially formed semiconductor device after the second trenches 302 have been filled. The second trenches 302 can be lined with an oxide liner 310, such as an oxide that is grown to a thickness between about 30 Å and 150 Å. As shown in FIG. 10, the trenches 302 may then be overfilled with a second filler material 312, such as with a high density plasma ("HDP") oxide that extends above the top of the trenches 302. Note that while the illustrated trenches 300, 302 have been filled in the illustrated embodiment by different techniques and embodiments, both sets of trenches are filled by forms of silicon oxide that chemically similar from the point of view of selective etching.

Figure 11:
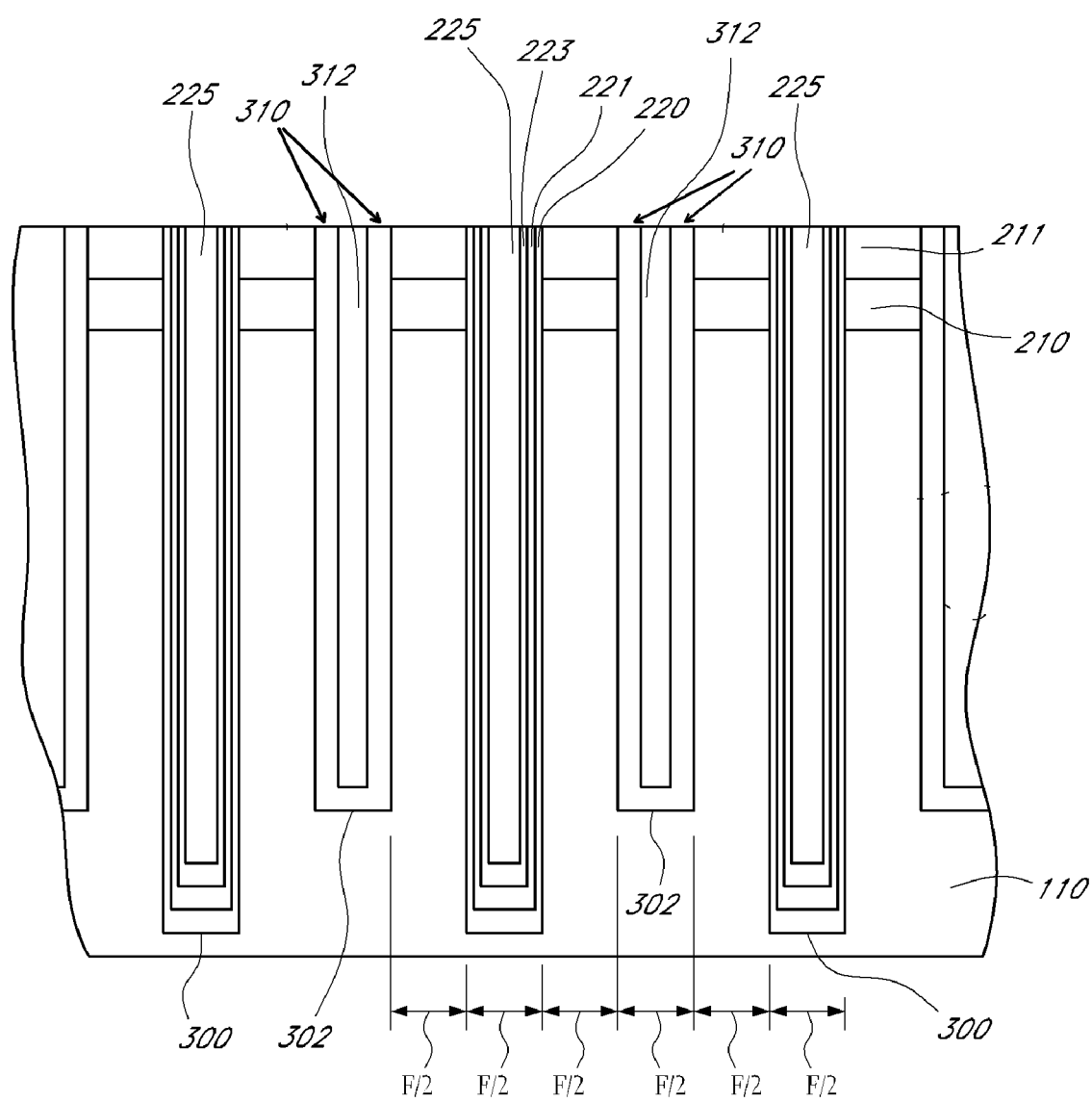
FIG. 11 illustrates a cross-sectional view of the partially formed semiconductor device of FIG. 10 after planarization stopping on an etch stop layer.

Following the filling of the trenches 302, the partially formed device may then be planarized. The planarization may be carried out using a chemical mechanical polishing ("CMP") process, and it may stop on the etch stop 211. It is typically difficult to control the planarization process with sufficient precision to stop at the top surface of the thin etch stop 211, such that a majority of the illustrated thin etch stop 211 thickness is consumed at the end of the CMP process. Typically between about 10 Å and 100 Å of the etch stop 211 is consumed in stopping the CMP process, which can represent between about 50% and 80% of the etch stop 211 thickness. A cross-sectional view of a partially formed device after this planarization step has been carried out is illustrated in FIG. 11.

In some embodiments, the surface of the device after the planarization step may primarily comprise an etch stop 211 and structural material, such as silicon oxide. The structural material can then be selectively recessed to approximately coplanar with the lower surface of the etch stop, for example by selectively etching the oxide against the nitride of the etch stop.

Figure 12:
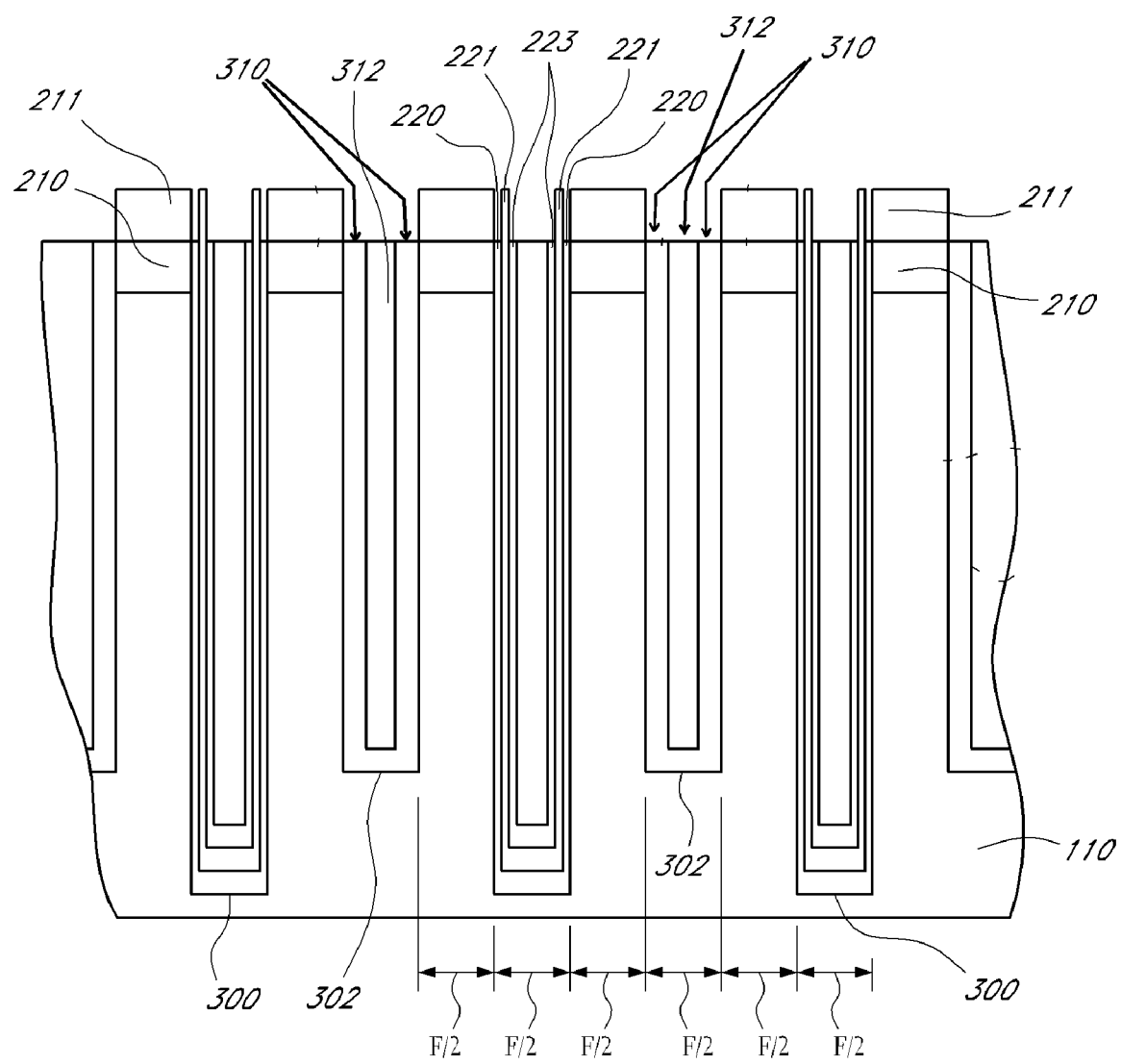
FIG. 12 illustrates a detail of a cross-sectional view of the partially formed semiconductor device of FIG. 11 after portions of the surface have been selectively recessed.

FIG. 12 illustrates a detail of a device's surface after structural materials have been selectively recessed. The amount that structural (illustrated as oxide) materials are recessed is preferably about equal to the thickness of the remaining etch stop 211. In the illustrated embodiment, the structural materials are recessed by between about 10 Å and 70 Å, more particularly between 30 Å and 50 Å. Thus, the recessed structural materials leave an upper surface approximately (e.g., within ±20 Å, more particularly within ±10 Å) coplanar with the lower surface of the etch stop 211. As shown in FIG. 12, other portions of the device, such as nitride liner layer 221, may protrude above the selectively recessed portion along with the etch stop 211.

Figure 13:
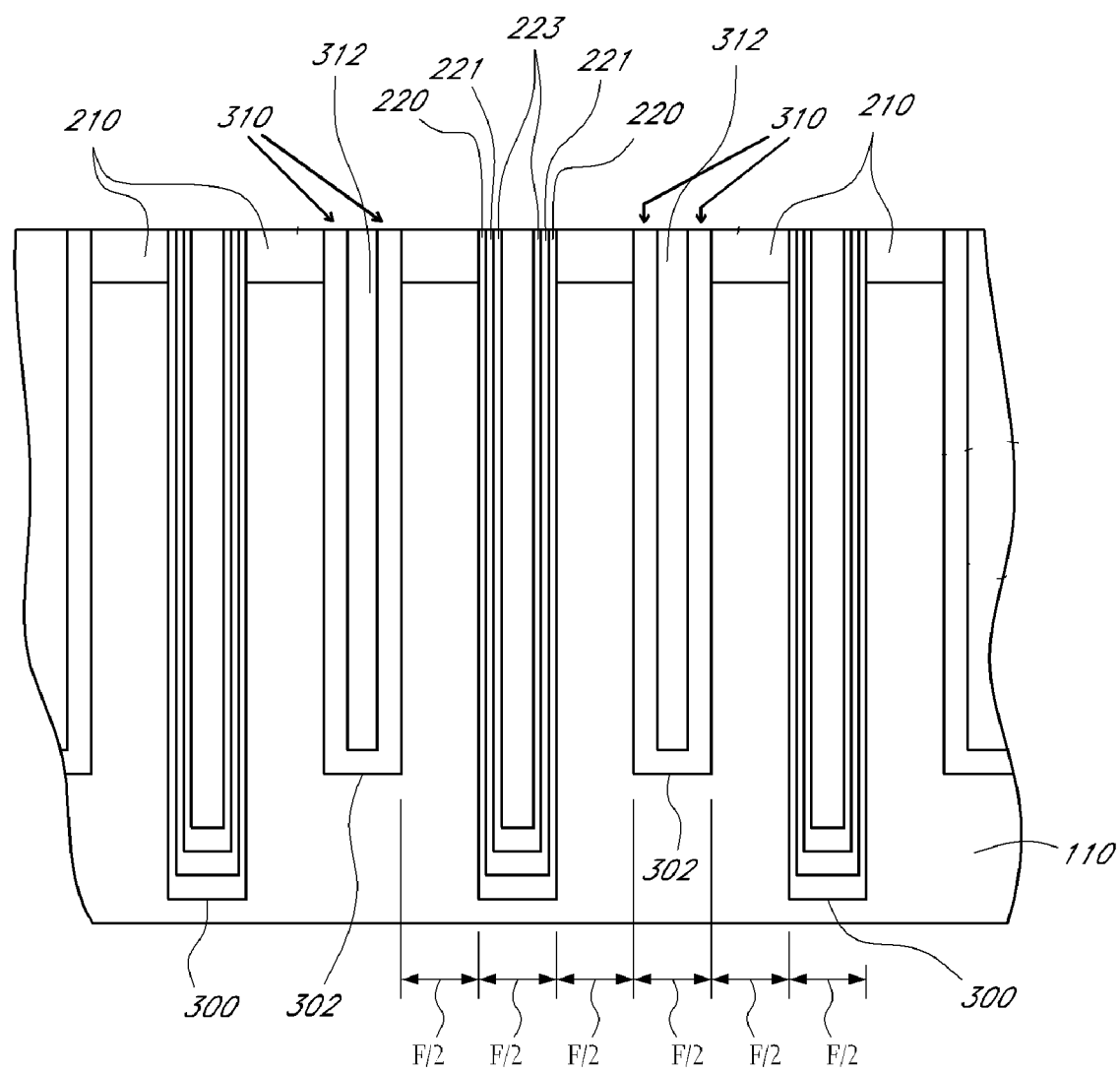
FIG. 13 illustrates a detail of a cross-sectional view of the partially formed semiconductor device of FIG. 12 after the etch stop layer has been removed.

Next, the etch stop 211 can be removed, for example by selectively etching nitride. Such an etching step may also remove other portions that protrude above the surface of the structural material, such as the nitride liner layer 221. The inventors have observed that such a process enhances the planarity of the device's surface. FIG. 13 illustrates a detail of a semiconductor device after these steps.

Figure 14:
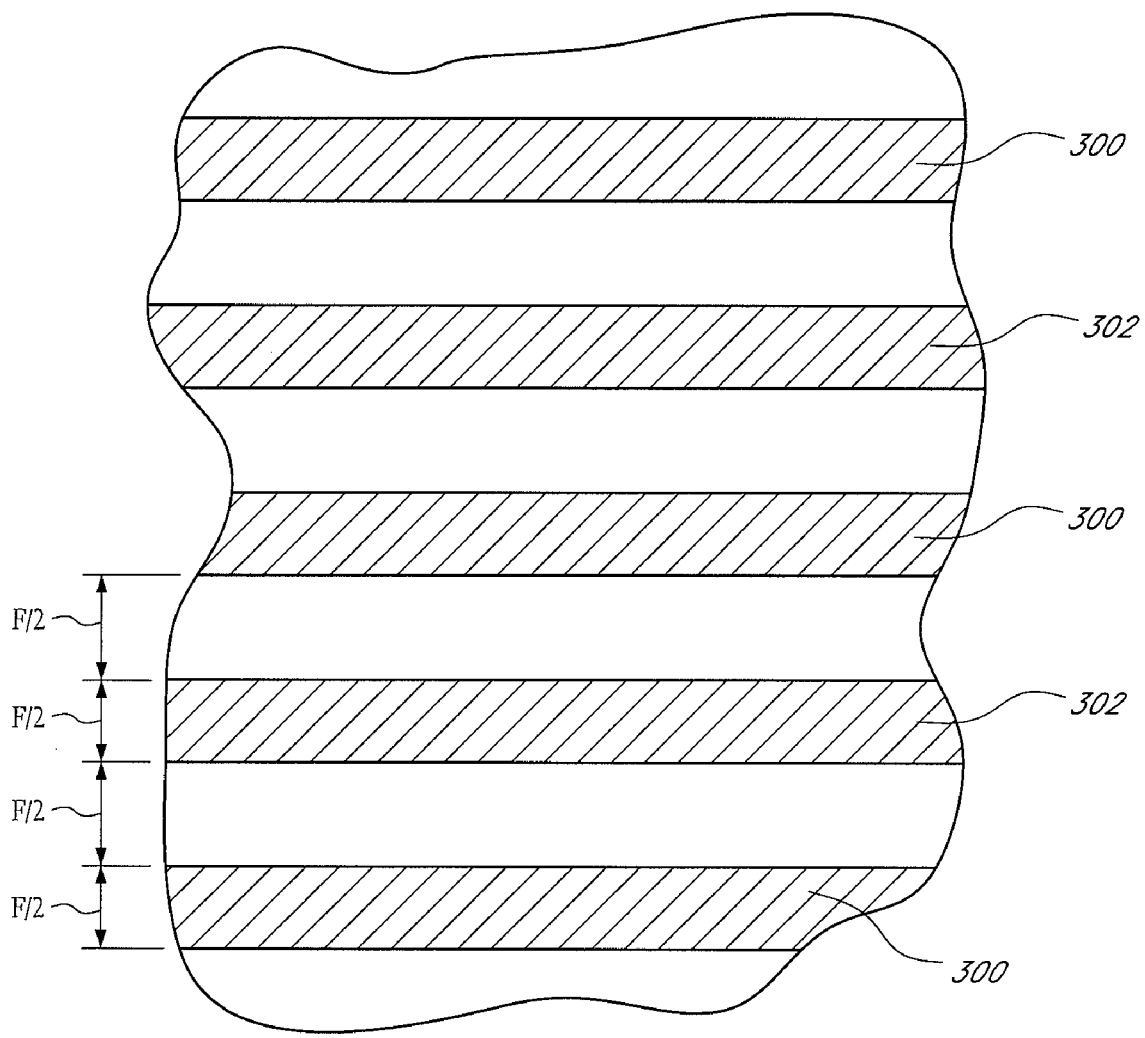
FIG. 14 shows a top-down view of the semiconductor device of FIG. 13.

FIGS. 11 and 14 illustrate parallel trenches filled with isolation material, made in accordance with the methods described herein. In one embodiment, the deeper trenches 300 represent shallow trench isolation between transistors in an array (e.g., a memory array such as DRAM). These deeper trenches alternate with parallel shallow trenches 302. As will be understood from the process flow of U.S. patent application No. 2006-0046407, published Mar. 2, 2006, the disclosure of which is incorporated by reference herein, these shallow trenches 302 can represent the gap between source and drain pillars in a U-shaped protruding transistor structure, and can remain filled with insulating material or can be replaced with gate dielectric and gate electrode materials for a "3-sided" channel structure. As described in the incorporated '407 publication, subsequent crossing trenches of an intermediate depth can provide gaps between rows of transistors in which gate electrode material can be formed to surround the U-shaped semiconductor structures at least on two sides. In other embodiments, the trenches can be employed for deep DRAM capacitors; can all be for trench isolation, and may be of approximately equal depth; can be damascene trenches in insulating material for later filling with metal lines; etc.

Although not illustrated in the figures, a sacrificial oxide layer with a thickness of between about 100 Å and 200 Å may then be grown and subsequently stripped in order to remove and/or repair any damaged silicon at the upper surface.

Methods have been described that provide several advantages for the formation of semiconductor structures. For example, methods have been taught for using a placeholder material as part of the formation of self-aligned trenches in substrates. Self-aligned trenches can be used as part of pitch doubling techniques, which promote device integration. For example, in the illustrated embodiment, the pitch of the partially formed device was ½ F at the stage shown in FIGS. 1-7, whereas the pitch is F at the stage shown in FIG. 13; the feature size shrinks from F at the stage of FIG. 1 to ½ F at the stage of FIG. 13. Fabrication techniques described herein advantageously enable more precise etching, such as by using a relatively thin second hard mask to improve the aspect ratio during etching of the trenches. Further, methods disclosed herein promote planarity at the surface of the semiconductor structure, such as by providing a relatively thin etch stop, and a sequence of recessing surrounding materials by an amount about equal the amount of etch stop remaining after consumption during a CMP step.

In accordance with one embodiment, a method is provided for forming a device. The method comprises forming a layer of polysilicon on a substrate and forming a first set of trenches in the substrate, wherein remaining portions of the polysilicon layer remain above the substrate in inter-trench regions between trenches of the first set. The method further comprises filling the first set of trenches with a filler material, wherein the filler material extends upward to at least a level adjacent the remaining portions of the polysilicon layer. Further, the method comprises selectively etching the remaining portions of the polysilicon layer from the inter-trench regions, forming spacers on sidewalls of the filler material in the inter-trench regions, and etching a second set of trenches into the substrate between the spacers.

In another embodiment, a method is provided for forming a device on a substrate. The method comprises forming an etch stop layer on the substrate and etching a plurality of first trenches through the etch stop layer and the substrate. The method further comprises filling the first trenches with an isolation material that protrudes above the substrate, forming spacers on sidewalls of the protruding portion of the isolation material, and etching a plurality of second trenches between the spacers. The method further comprises filling the second trenches with a second filler material, planarizing the second filler material and stopping planarizing on the etch stop layer.

In another embodiment, a method is provided of forming an integrated circuit. The method comprises forming a structure on a substrate, the structure comprising a structural material and an etch stop, the etch stop having an upper surface and a lower surface. The method further comprises planarizing the structure and stopping planarizing on the etch stop. The method further comprises selectively recessing the structural material to be approximately coplanar with the lower surface of the etch stop, and selectively removing the etch stop.

It will be appreciated by those skilled in the art that various other omissions, additions and modifications may be made to the methods and structures described above without departing from the scope of the invention. For example, while the illustrated embodiments involve etching alternating "shallow" trench isolation ("STI") and in a semiconductor material and filling with electrically insulating isolation materials, the skilled artisan will appreciate applications of the principles and advantages taught herein for other contexts. For example, some of the methods taught herein can be applied to defining closely spaced, self-aligned damascene trenches for filling with metal lines. All such changes are intended to fall within the scope of the invention, as defined by the appended claims.

What is claimed is:

1. A method of forming an integrated circuit, the method comprising:
    forming a structure on a substrate, the structure comprising a structural material and an etch stop, the etch stop having an upper surface and a lower surface;
    planarizing the structure and stopping planarizing on the etch stop;
    selectively recessing the structural material such that an exposed upper surface of the structural material is approximately coplanar with the lower surface of the etch stop at the end of said selectively recessing; and
    selectively removing the etch stop to leave an approximately coplanar surface including the previously exposed upper surface of the recessed structural material and an upper surface of a material exposed by removing the etch stop.

2. The method of claim 1, wherein the structural material comprises a form of silicon oxide.

3. The method of claim 1, wherein the etch stop comprises nitride.

4. The method of claim 3, wherein the etch stop comprises $Si_3N_4$.

5. The method of claim 3, wherein selectively removing the etch stop comprises exposing an oxide surface.

6. The method of claim 1, wherein, before selectively removing the etch stop and after planarizing, the etch stop has a thickness between about 10 Å and 70 Å.

7. The method of claim 1, wherein selectively recessing the structural material to be approximately coplanar with the lower surface of the etch stop comprises selectively recessing the structural material to a level within ±20 Å of the lower surface of the etch stop.

8. The method of claim 1, wherein the material exposed by removing the ecth stop comprises a different material than the structural material.

9. The method of claim 1, wherein the approximately coplanar surface left from selectively removing the etch stop includes substantially all materials directly surrounding the exposed upper surface of the recessed structural material in plan view.

10. The method of claim 1, further comprising:
   forming a trench in the substrate; and
   lining the trench with a liner layer;
   wherein the etch stop and an adjacent etch stop are disposed over the substrate on opposing sides of the trench.

11. A method of forming an integrated circuit, the method comprising:
   forming a structure on a substrate, the structure comprising a structural material and an etch stop adjacent the structural material, the etch stop having an upper surface at a first height above the substrate and a lower surface at a second height above the substrate;
   planarizing the structure at approximately the first height;
   selectively recessing the structural material to approximately the second height at the end of said selectively recessing; and
   selectively removing the etch stop to expose an underlying surface, wherein the underlying surface is approximately coplanar with an exposed upper surface of the recessed structural material.

12. The method of claim 11, wherein forming the structure comprises forming the structural material comprising silicon oxide, and forming the etch stop comprising silicon nitride.

13. The method of claim 11, wherein selectively removing the etch stop exposes the underlying surface comprising an oxide.

14. The method of claim 11, wherein selectively recessing the structural material to approximately the second height comprises selectively recessing the structural material to a level within ±20 Å of the second height.

15. A method of forming an integrated circuit, the method comprising:
   forming a structure on a substrate, the structure comprising a structural material and an etch stop, the etch stop having an upper surface and a lower surface;
   forming a trench in the substrate;
   lining the trench with a liner layer, wherein the etch stop and an adjacent etch stop are disposed over the substrate on opposing sides of the trench;
   planarizing the structure and stopping planarizing on the etch stop;
   selectively recessing the structural material such that an exposed upper surface of the structural material is approximately coplanar with the lower surface of the etch stop, wherein a portion of the liner layer protrudes above the structural material between the etch stop and the adjacent etch stop after selectively recessing the structural material; and
   selectively removing the etch stop to leave an approximately coplanar surface including the exposed upper surface of the recessed structural material.

16. The method of claim 15, wherein the portion of the liner layer that protrudes above the structural material is selectively removed while selectively removing the etch stop.

17. The method of claim 15, wherein the portion of the liner layer that protrudes above the structural material comprises nitride.

18. The method of claim 17, further comprising lining the trench with at least one oxide liner layer.

19. The method of claim 18, wherein lining the trench with at least one oxide liner includes forming oxide liners on opposing sides of the liner layer.

20. The method of claim 15, wherein forming the structure comprises forming the structural material comprising silicon oxide, and forming the etch stop comprising silicon nitride.

* * * * *